(12) United States Patent
Yang et al.

(10) Patent No.: US 10,819,326 B1
(45) Date of Patent: Oct. 27, 2020

(54) DIGITAL CLOCK GENERATION APPARATUS AND METHOD

(71) Applicant: ELECTRONICS AND TELECOMMUNICATIONS RESEARCH INSTITUTE, Daejeon (KR)

(72) Inventors: Yil Suk Yang, Daejeon (KR); Hyun Joong Lee, Daejeon (KR); Chang Han Je, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/699,379

(22) Filed: Nov. 29, 2019

(30) Foreign Application Priority Data

May 29, 2019 (KR) ........................ 10-2019-0063382

(51) Int. Cl.
*H03K 5/135* (2006.01)
*H03K 3/017* (2006.01)
*H03K 5/00* (2006.01)
*H03K 5/133* (2014.01)

(52) U.S. Cl.
CPC ............ *H03K 5/135* (2013.01); *H03K 3/017* (2013.01); *H03K 5/00006* (2013.01); *H03K 5/133* (2013.01); *H03K 2005/00058* (2013.01)

(58) Field of Classification Search
None
See application file for complete search history.

(56) References Cited

U.S. PATENT DOCUMENTS

| 7,777,543 | B2 | 8/2010 | Park |
| 7,956,656 | B2* | 6/2011 | Obkircher ............ H03L 7/0814 327/116 |
| 8,841,951 | B2 | 9/2014 | Lee et al. |
| 9,018,996 | B1* | 4/2015 | Zarei ...................... H03B 27/00 327/231 |
| 9,036,764 | B1* | 5/2015 | Hossain ............... H03L 7/0891 375/376 |
| 9,742,386 | B2 | 8/2017 | Jin |
| 10,033,365 | B2 | 7/2018 | Elbadry et al. |
| 10,409,319 | B2* | 9/2019 | Rajwani ............. G06F 9/30141 |
| 2007/0152727 | A1 | 7/2007 | Lee et al. |
| 2009/0174441 | A1* | 7/2009 | Gebara .................... H03L 5/00 327/115 |
| 2009/0179674 | A1* | 7/2009 | Tamura .................. H03K 5/133 327/155 |
| 2010/0039157 | A1* | 2/2010 | Kaeriyama ........... H03L 7/0995 327/292 |

(Continued)

FOREIGN PATENT DOCUMENTS

KR 101685630 B1 12/2016

*Primary Examiner* — Lincoln D Donovan
*Assistant Examiner* — Khareem E Almo
(74) *Attorney, Agent, or Firm* — Rabin & Berdo, P.C.

(57) ABSTRACT

The present invention relates to a digital clock generation apparatus. The digital clock generation apparatus is directed to providing a digital clock generation apparatus in which hardware is simple, duty cycles are easily controlled, and various duty cycles and various frequency clocks (n× clocks) are provided as compared to a 1× single-phase clock generation apparatus or a 1× multi-phase clock generation apparatus based on the conventional programmable delay element chain.

16 Claims, 9 Drawing Sheets

(56) References Cited

U.S. PATENT DOCUMENTS

| | | | |
|---|---|---|---|
| 2010/0046674 A1* | 2/2010 | Davis | H03D 7/00 |
| | | | 375/340 |
| 2011/0215851 A1 | 9/2011 | Oh et al. | |
| 2017/0310456 A1* | 10/2017 | Tajalli | H03L 7/0996 |
| 2019/0007055 A1* | 1/2019 | Nelson | H03L 7/0807 |

* cited by examiner

DIGITAL CLOCK GENERATION APPARATUS AND METHOD

CROSS-REFERENCE TO RELATED APPLICATION

This application claims priority to and the benefit of Korean Patent Application No. 2019-0063382, filed on May 29, 2019, the disclosure of which is incorporated herein by reference in its entirety.

BACKGROUND

1. Field of the Invention

The present invention relates to a digital clock generation apparatus and method, and more particularly, to a digital clock generation apparatus and method for generating various types of clocks.

2. Discussion of Related Art

Generally, clock generation apparatuses provide main clock sources or auxiliary clock sources to microprocessor units (MPUs), microcontroller units (MCUs), digital signal processors (DSPs), signal converters, memories, and peripheral devices, which are used in electronic devices, such as computers, mobile phones, and home appliances.

Currently, analog-based phase-locked loop (PLL) clock generation apparatuses and digital-based clock generation apparatuses are being used in all types of electronic devices.

Here, the digital clock generation apparatus that is easier to control and implement than the analog PLL clock generation apparatus is widely in use.

Among digital-based clock generation apparatuses with many implementation techniques, the most commonly used digital clock generation apparatus is a digital clock generation apparatus based on a programmable delay element chain (PDEC).

The conventional PDEC-based digital clock generation apparatus generates a 1× single-phase clock or a 1× multi-phase clock, which has various duty cycles having the same frequency (a 1× clock) as a clock input source, using a clock input source signal and a 180° delayed clock signal which is delayed by 180°, that is, a half period, from the clock input source.

However, since the conventional PDEC-based digital clock generation apparatus generates only the 1× single-phase clock or the 1× multi-phase clock having the same frequency as the clock input source, there are problems in that the conventional PDEC-based digital clock generation apparatus is difficult to apply to applications that require various clocks, the number of delay configuration chains for generating the 180° delayed clock signal in the clock input source is increased, and the amount of hardware is increased due to difficult control.

Further, there are problems in that it is difficult for the conventional PDEC-based digital clock generation apparatus to generate an accurate 50% duty cycle clock, and thus is provided to be limited to applications such as memory systems that require precise 50% duty cycle clocks.

SUMMARY OF THE INVENTION

The present invention is directed to providing a digital clock generation apparatus in which hardware is simple, duty cycles are easily controlled, and various duty cycles and various frequency clocks (n× clocks) are provided as compared to a 1× single-phase clock generation apparatus or a 1× multi-phase clock generation apparatus based on the conventional programmable delay element chain.

Effects of the present invention are not limited to the above-described effects, and other unmentioned effects may be clearly understood by those skilled in the art from the following descriptions.

According to an aspect of the present invention, there is provided a digital clock generation apparatus including a delayed clock generation unit configured to generate a plurality of delayed clock signals with respect to an input clock signal; a delayed clock selection unit configured to select one of the generated delayed clock signals; a multiplied clock generation unit configured to generate a clock signal of which a frequency is multiplied by a preset multiple using the selected delayed clock signal and the input clock signal; a phase separation unit configured to generate a first phase clock signal and a second phase clock signal, which have a preset interval between phases thereof, from the multiplied clock signal; a duty cycle processing unit configured to receive the generated first and second phase clock signals and generate a duty cycle clock signal having a preset duty cycle; and a clock signal output unit configured to output at least one of the generated multiplied clock signal, the generated first phase clock signal, the generated second phase clock signal, and the generated duty cycle clock signal.

According to another aspect of the present invention, there is provided a digital clock generation method including determining a period (T) of an input clock signal; determining a delay time on the basis of the period of the input clock signal and generating a delayed clock signal using the determined delay time; generating a multiplied clock signal having a duty cycle value which is determined based on the period of the input clock signal and having a frequency of a predetermined multiple of a frequency of the input clock signal; generating a first phase clock signal and a second phase clock signal, which have a preset interval between phases thereof, from the multiplied clock signal; receiving the generated first and second phase clock signals and generating a duty cycle clock signal having a preset duty cycle; and outputting at least one of the generated multiplied clock signal, the generated first phase clock signal, the generated second phase clock signal, and the generated duty cycle clock signal.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention and methods of achieving the same will be clearly understood with reference to the accompanying drawings and embodiments described in detail below. However, the present invention is not limited to the embodiments to be disclosed below but may be implemented in various different forms. The embodiments are provided in order to fully explain the present embodiments and fully explain the scope of the present embodiments for those skilled in the art. The scope of the present embodiments is only defined by the appended claims. Meanwhile, terms used in this specification are considered in a descriptive sense only and not for purposes of limitation. In this specification, the singular forms include the plural forms unless the context clearly indicates otherwise. It will be understood that the terms "comprise" and/or "comprising" when used herein, specify some stated components, steps, operations, and/or elements, but do not preclude the presence or addition of one or more other components, steps, operations, and/or elements.

Figure 1A:
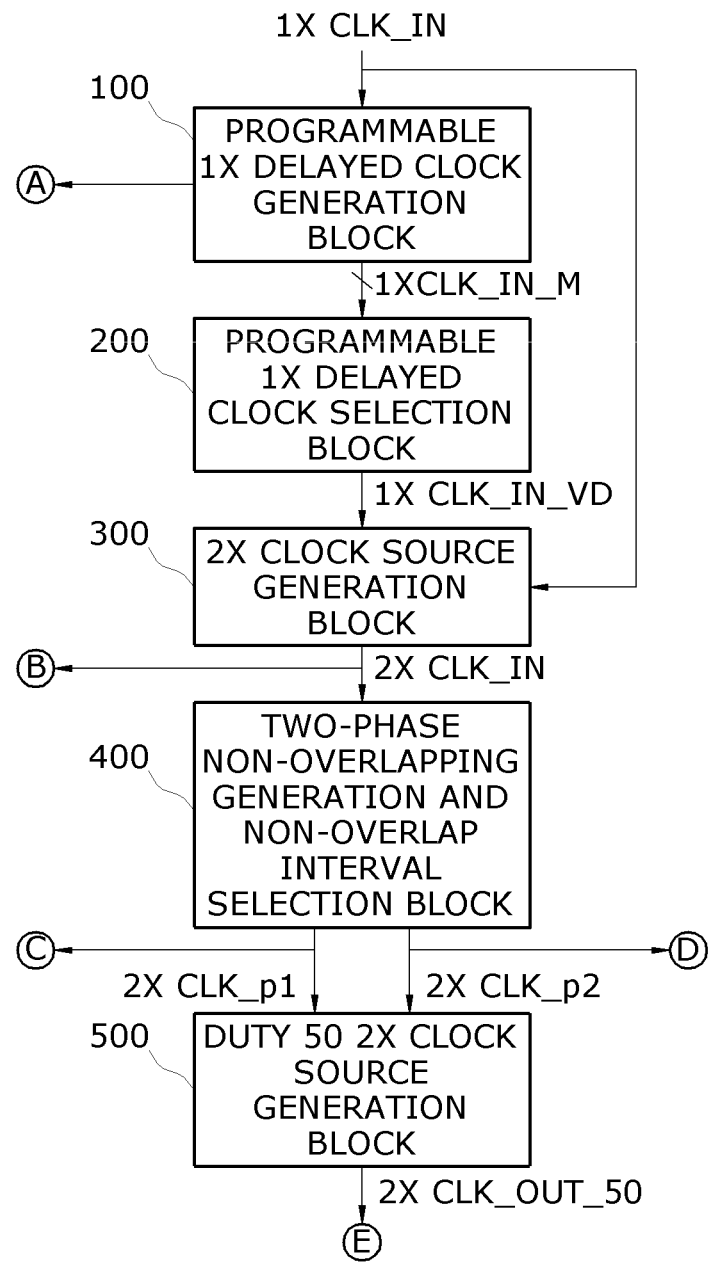
FIG. 1A TO FIG. 1B is a configuration diagram for describing a digital clock generation apparatus according to an embodiment of the present invention.
Figure 1B:
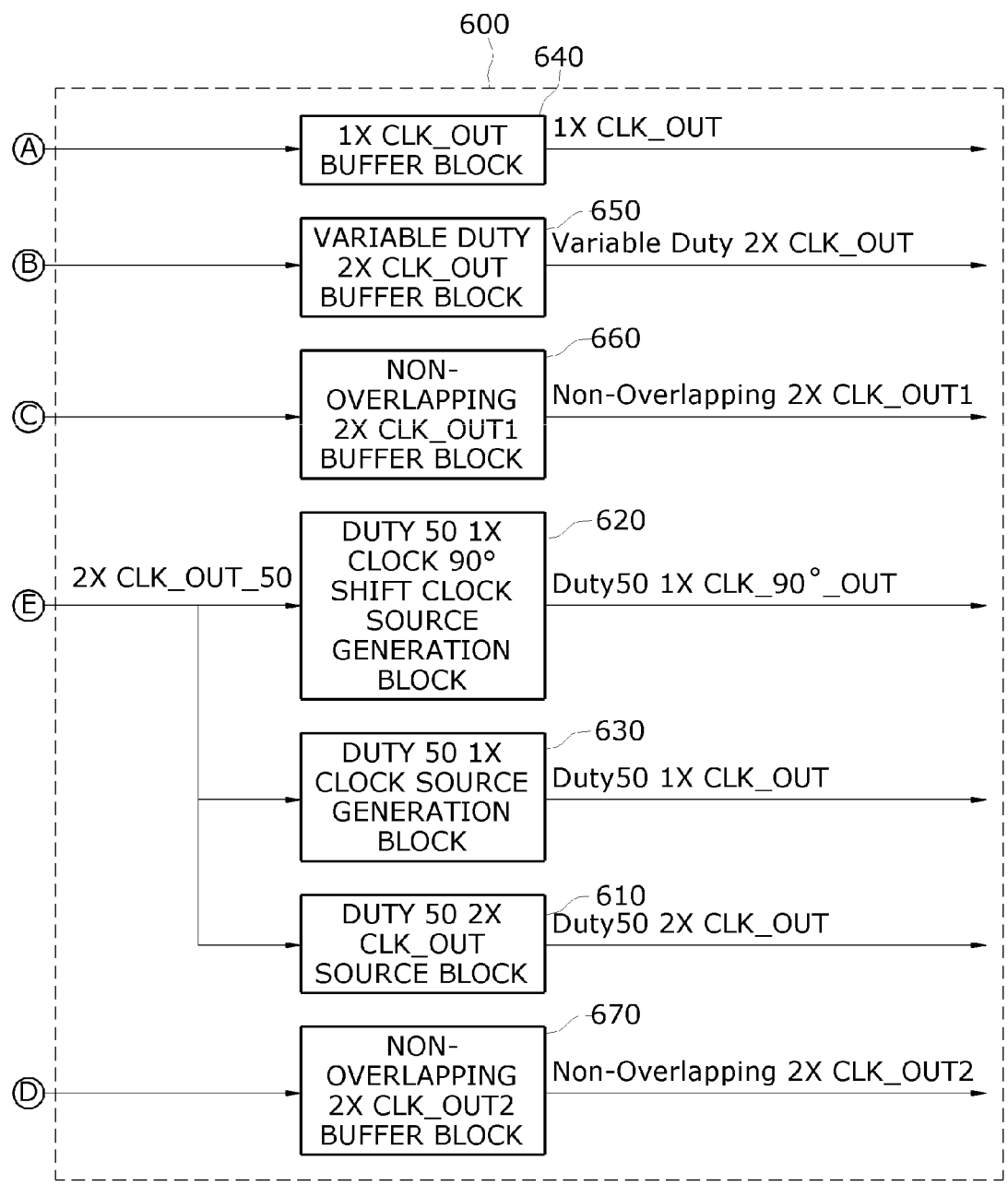

Hereinafter, exemplary embodiments of the present invention will be described in detail with reference to the accompanying drawings. FIG. 1A TO FIG. 1B is a configuration diagram for describing a digital clock generation apparatus according to an embodiment of the present invention.

The digital clock generation apparatus according to the embodiment of the present invention includes a delayed clock generation unit (a programmable 1× delayed clock generation block) 100, a delayed clock selection unit (a programmable 1× delayed clock selection block) 200, a multiplied clock generation unit (a 2× clock source generation block) 300, a phase separation unit (a two-phase non-overlapping generation and non-overlap interval selection block) 400, a duty cycle processing unit (a duty 50 2× clock source generation block) 500, and a clock signal output unit 600.

The programmable 1× delayed clock generation block 100 delays an input clock signal (a 1×CLK_IN signal) to generate delayed clock signals (1× CLK_IN_M signals), which are various delay signals, and provides the generated various delayed clock signals (the 1×CLK_IN_M signals) to the programmable 1× delayed clock selection block 200. The programmable 1× delayed clock generation block 100 may connect delay units having a constant delay time using a chain and provide the 1×CLK_IN_M signals having various delay times with respect to the 1×CLK_IN signal because each of the delay units has a preset delay time. Here, pre-stored information may be used as the delay time according to multiplication to be programmed or generated by a user.

The programmable 1× delayed clock selection block 200 selects one of the plurality of delayed clock signals (the 1×CLK_IN_M signals) and provides a 1×CLK_IN_VD signal, which is the selected specific delay signal, to the 2× clock source generation block 300. To this end, the programmable 1× delayed clock selection block 200 functions as a multiplexer (MUX) which selects a specific delay signal (a 1×CLK_IN_VD signal) among various delay signals (the 1×CLK_IN_M signals). In this case, the programmable 1× delayed clock selection block 200 may determine a duty cycle according to a program.

The 2× clock source generation block 300 generates a clock signal (a 2×CLK_IN signal), which is multiplied by being synchronized to the selected specific delay signal (the 1×CLK_IN_VD signal) and a rising or falling edge of the input clock signal (the 1×CLK_IN signal), and outputs the generated clock signal to the two-phase non-overlapping generation and non-overlap interval selection block 400. In this case, a duty cycle of the generated 2×CLK_IN signal ranges from zero to one quarter of a period T of the 1×CLK_IN signal.

The two-phase non-overlapping generation and non-overlap interval selection block 400 generates two clock signals (two-phase non-overlapping clock) having a preset interval between phases thereof from the input 2×CLK_IN signal and provides the generated two-phase non-overlapping clock to the duty 50 2× clock source generation block 500. Here, the two-phase non-overlapping clock includes a first phase clock signal (a 2×CLK_p1 signal) and a second phase clock signal (a 2×CLK_p2 signal).

Figure 2:
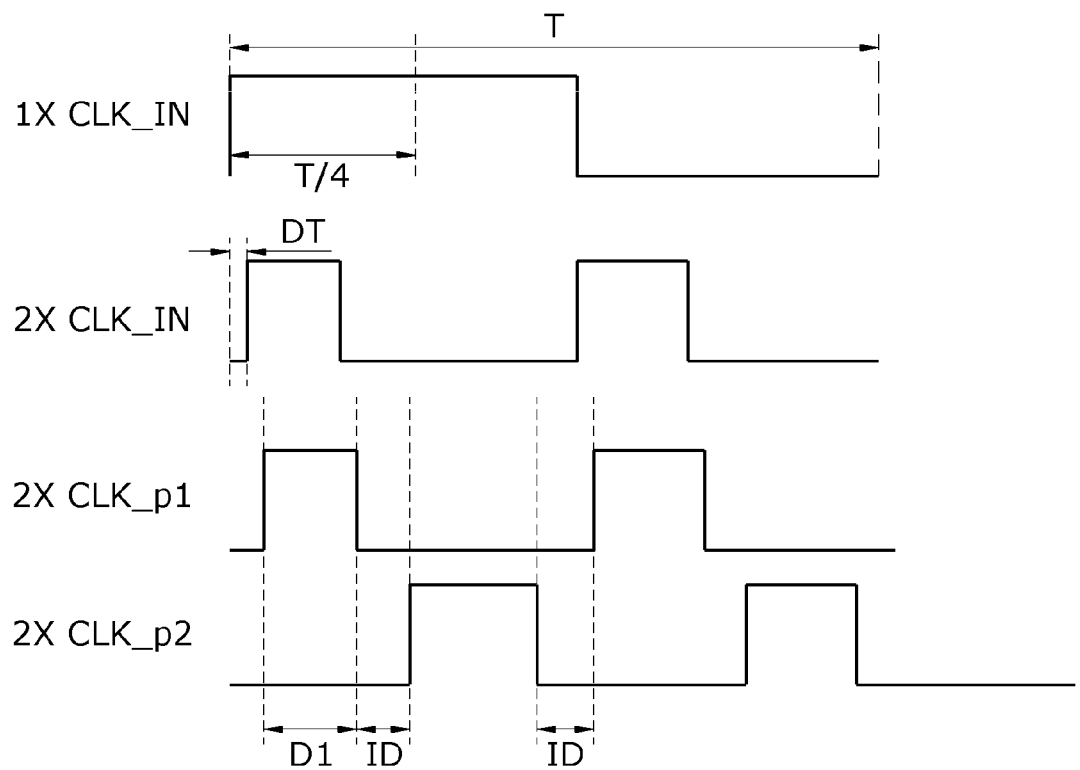
FIG. 2 is a signal timing diagram of a two-phase non-overlapping generation and non-overlap interval selection block of the present invention.

In this case, the two-phase non-overlapping clock generated in the two-phase non-overlapping generation and non-overlap interval selection block 400 is as shown in FIG. 2.

That is, the two-phase non-overlapping generation and non-overlap interval selection block 400 generates the first non-overlap phase clock signal (the 2×CLK_p1 signal) in a high cycle of the clock signal (the 2×CLK_IN single), which has various duty cycles and is multiplied by a preset integer, and generates the second phase clock signal (the 2×CLK_p2 signal) so as to overlap the first phase clock signal (the 2×CLK_p1 signal) in a low cycle, as shown in FIG. 2.

Here, T is an inverse of a frequency of the 1×CLK_IN signal and denotes a one period time, T/4 denotes a delay time which is delayed by 90° from the input clock signal (the 1×CLK_IN signal), DT denotes a propagation time on a time axis of the input clock signal (the 1×CLK_IN signal), and D1 is a duty cycle of the 2×CLK_p1 signal, is the same as the duty cycle of the 2×CLK_IN signal, and denotes a delay time of the input clock signal (the 1×CLK_IN signal). ID denotes a non-overlap phase interval between the 2×CLK_p1 signal and the 2×CLK_p2 signal.

The duty 50 2× clock source generation block 500 generates a duty cycle clock signal (a 2×CLK_OUT_50 signal) with a 50% duty cycle using the first phase clock signal (the 2×CLK_p1 signal) and the second phase clock signal (the 2×CLK_p2 signal) which are generated by the phase separation unit 400 and provides the generated 2×CLK_OUT_50 signal with the 50% duty cycle to a first output unit (a duty 50 2×CLK_OUT source block) 610, a second output unit (a duty 50 1× clock 90° shift clock source generation block) 620, and a third output unit (a duty 50 1× clock source generation block) 630.

The duty 50 2× clock source generation block 500 may maintain the non-overlap interval ID of (T/4+DT)−D1 between the 2×CLK_p1 signal and the 2×CLK_p2 signal to be constant all the time and generate a 2×CLK_OUT_50 signal with an accurate 50% duty cycle.

The clock signal output unit 600 outputs at least one of the input clock signal being input, the generated multiplied clock signal, the generated first phase clock signal, the generated second phase clock signal, and the generated duty cycle clock signal. The clock signal output unit 600 includes the first output unit (the duty 50 2×CLK_OUT source block) 610, the second output unit (the duty 50 1× clock 90° shift clock source generation block) 620, the third output unit (the duty 50 1× clock source generation block) 630, a fourth output unit (a 1×CLK_OUT buffer block) 640, a fifth output unit (a variable duty 2×CLK_OUT buffer block) 650, a sixth output unit (a non-overlapping 2×CLK_OUT1 buffer block) 660, and a seventh output unit (a non-overlapping 2×CLK_OUT2 buffer block) 670.

The duty 50 2×CLK_OUT source block 610 supplies the generated duty cycle clock signal (the 2×CLK_OUT_50 signal) with the 50% duty cycle without any change.

The duty 50 1× clock 90° shift clock source generation block 620 converts the generated 2×CLK_OUT_50 signal with the 50% duty cycle into a phase shifted signal (a 1×CLK_90_0_50 signal), which is delayed by 90° from the input clock signal (the 1×CLK_IN signal), has a 50% duty cycle, and is divided to be a frequency of the input clock signal, and outputs the converted phase shifted signal. The duty 50 1× clock 90° shift clock source generation block 620 generates a 1×CLK_90_O_50 signal with a 50% duty cycle, which is delayed by 90° from the input clock signal (the 1×CLK_IN signal) by being divided by two to a falling edge from the 2×CLK_OUT_50 signal of the duty 50 2× clock source generation block 500.

The duty 50 1× clock source generation block 630 divides the generated duty cycle clock signal (the 2×CLK_OUT_50 signal) with the 50% duty cycle by the frequency of the input clock signal with respect to the input clock signal (the 1×CLK_IN signal), converts the divided signal into a duty signal (a 1× CLK_O_50 signal) with the same frequency as the input clock signal, and outputs the converted duty signal. The duty 50 1× clock source generation block 630 generates a duty signal (a 1×CLK_O_50 signal) with a 50% duty cycle, which is divided by two based on a rising edge from the 2×CLK_OUT_50 signal to have the frequency of the input clock signal.

In the above-described embodiment, the duty 50 1× clock 90° shift clock source generation block 620 and the duty 50 1× clock source generation block 630 are described as outputting the clock signals with the 50% duty cycle, but the present invention is not limited thereto. In addition, the duty 50 1× clock 90° shift clock source generation block 620 and the duty 50 1× clock source generation block 630 may output signals having various other duty cycles.

Hereinafter, an overall timing of a digital clock generation apparatus of the present invention will be described below with reference to FIG. 3, and a name of each signal is the same as that shown in FIG. 1A TO FIG. 1B.

Figure 3:
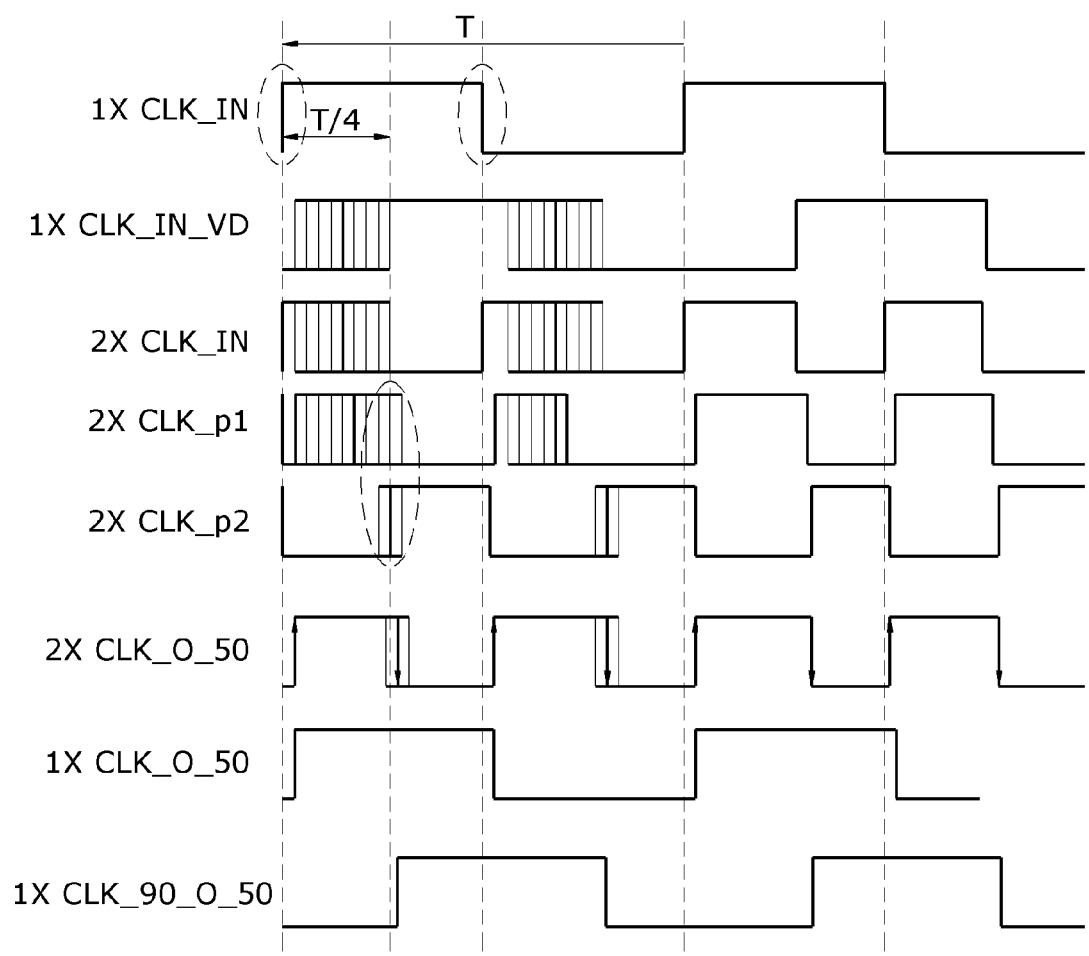
FIG. 3 is an overall timing diagram of a digital clock generation apparatus of the present invention.

As shown in FIG. 3, a maximum delay time of a 1×CLK_IN_VD signal is less than T/4, and a 2×CLK_IN signal and a 2×CLK_p1 signal are determined by the 1×CLK_IN_VD signal.

In addition, it can be seen that a 2×CLK_p2 signal is generated at a time of T/4 with respect to a 1×CLK_IN signal.

It can be seen that a 2×CLK_OUT_50 signal has an accurate 50% duty cycle due to the 2×CLK_p1 and 2×CLK_p2 signals, a 1×CLK_O_50 signal is divided by two by being synchronized to a rising edge of the 2×CLK_OUT_50 signal, and a 1×CLK_90_0_50 signal is divided by two by being synchronized to a falling edge of the 2×CLK_OUT_50 signal.

Figure 4A:
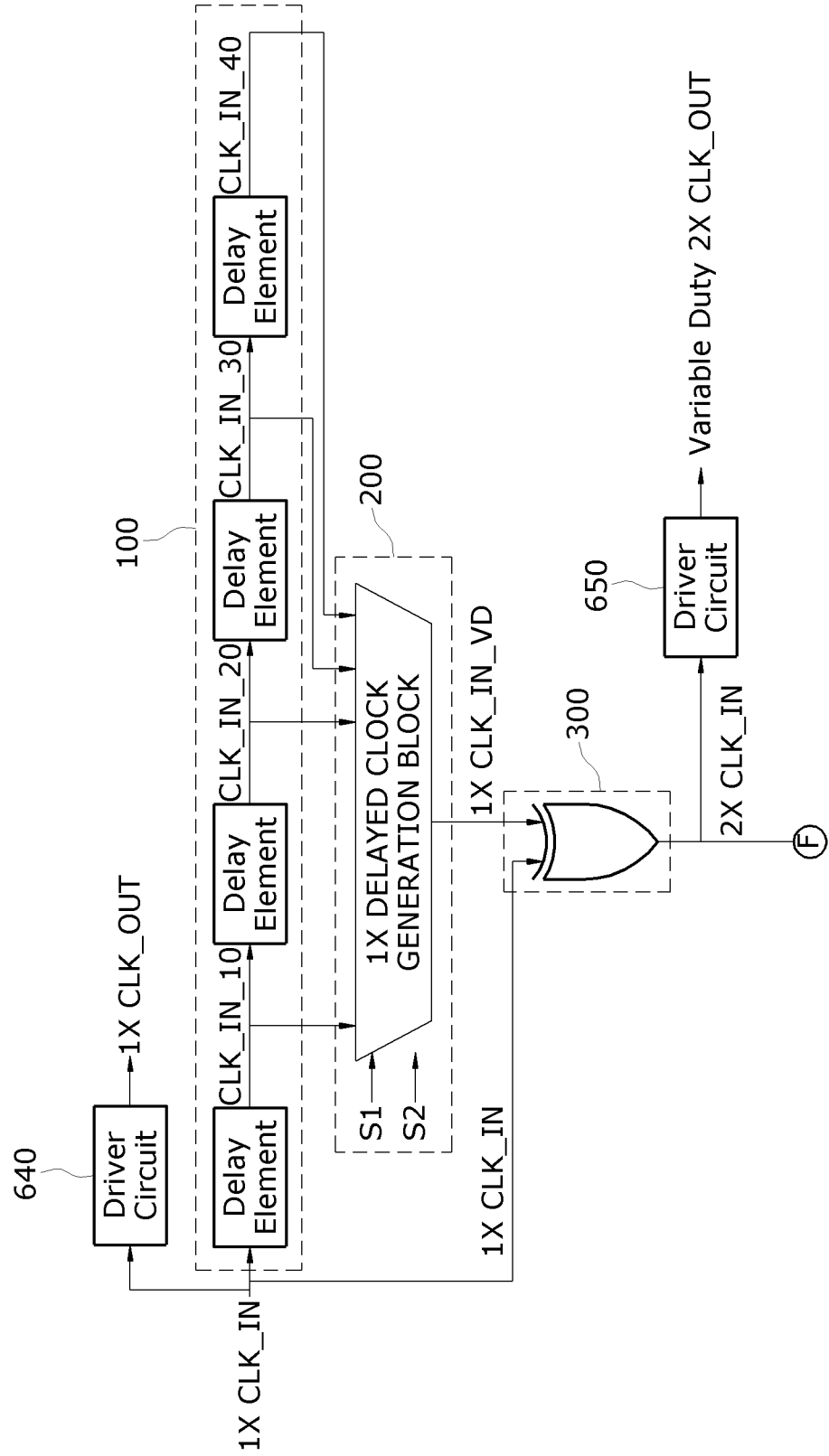
FIG. 4A TO FIG. 4C is an actual configuration diagram of a digital clock generation apparatus of the present invention.
Figure 4B:
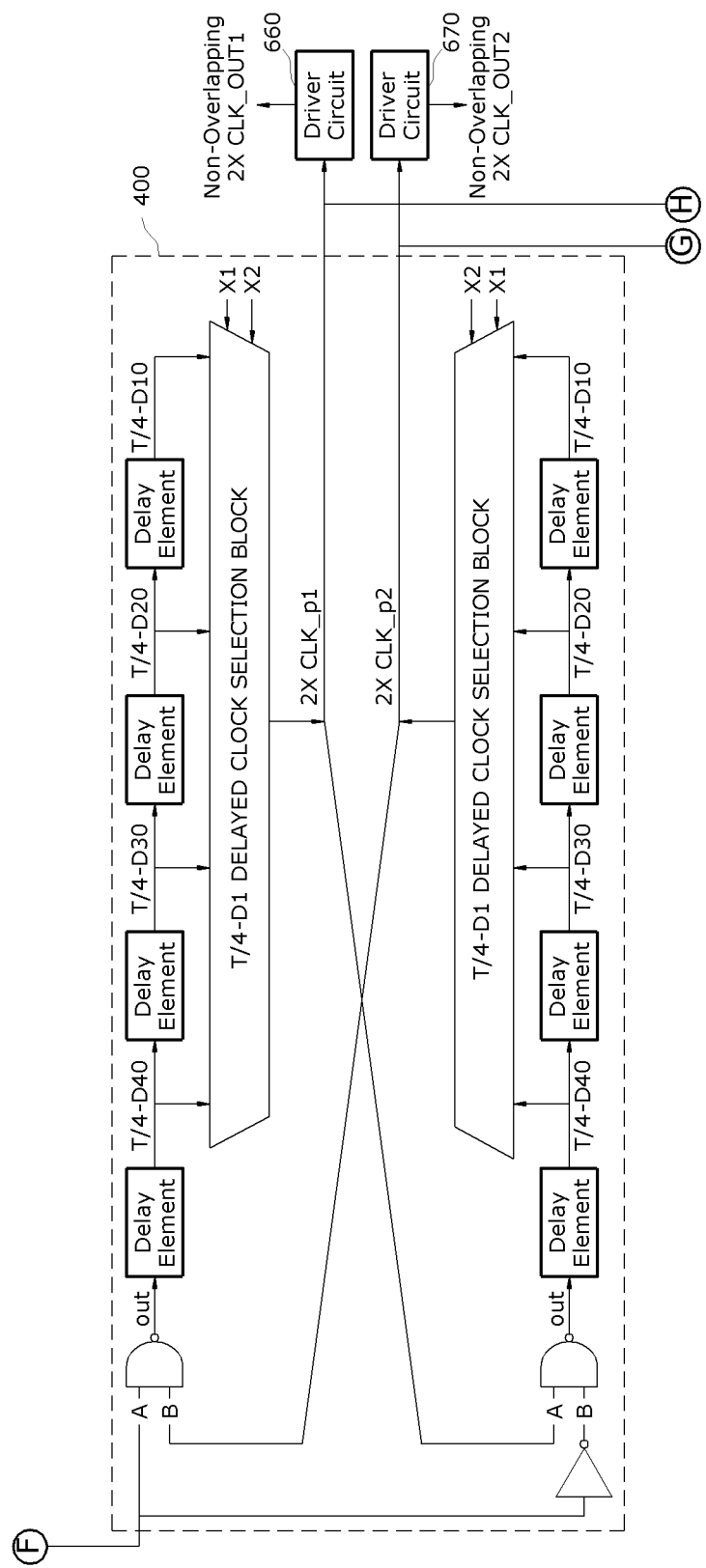
Figure 4C:
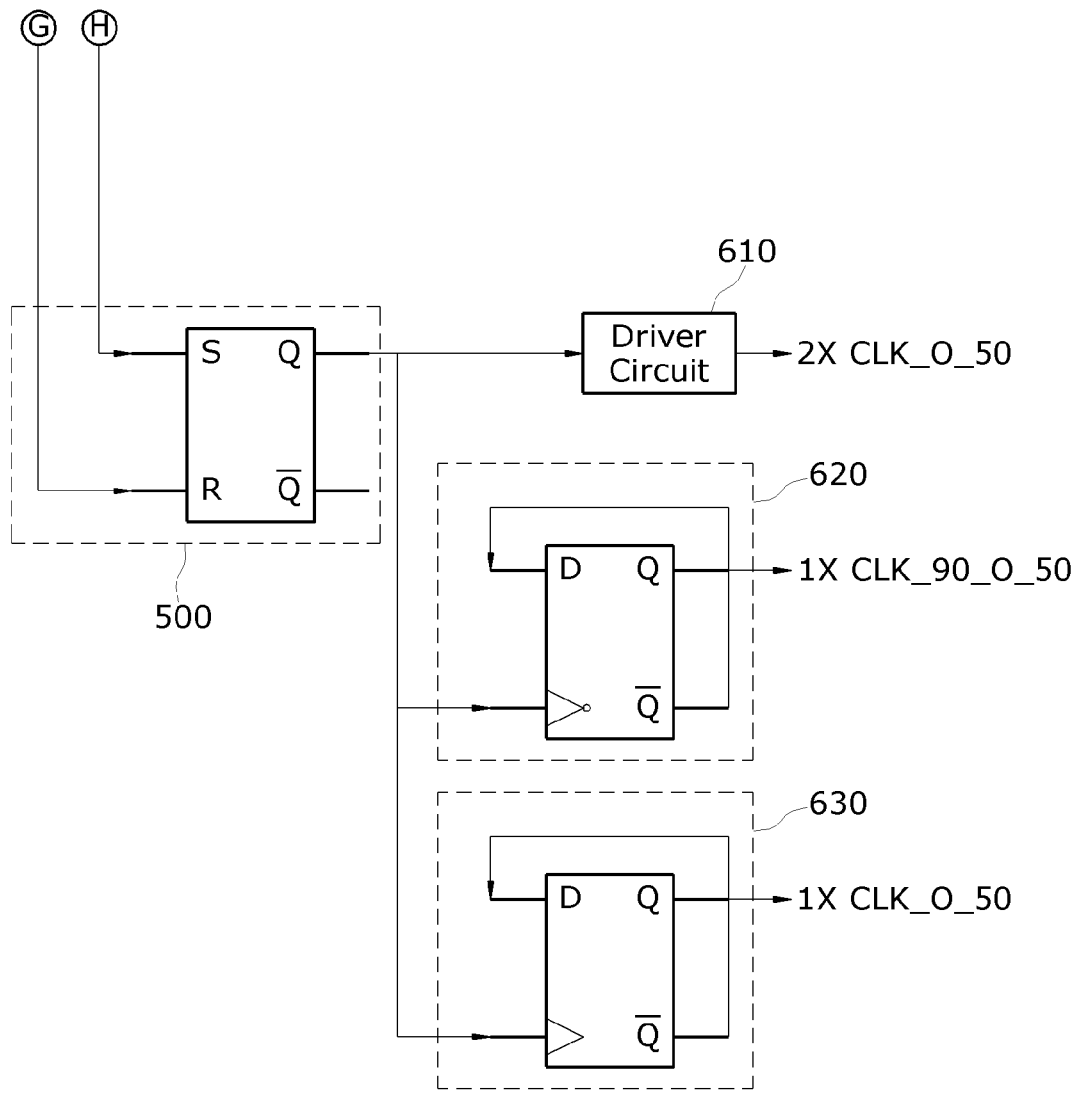

FIG. 4A TO FIG. 4C is a configuration diagram of a digital clock generation apparatus of the present invention. As shown in FIG. 4A TO FIG. 4C, a programmable 1× delayed clock generation block 100 of a digital clock generation apparatus according to an embodiment of the present invention includes four delay units, but the number of delay units is not limited thereto, and the programmable 1× delayed clock generation block 100 generates 1×CLK_IN_M signals having delay times of 10, 20, 30, and 40 with respect to an input clock signal (a 1×CLK_IN signal).

A programmable 1× delayed clock selection block 200 may be implemented as a 4 to 1 MUX which selects one of four clocks.

A 2× clock source generation block 300 may be implemented using an exclusive OR.

A two-phase non-overlapping generation and non-overlap interval selection block 400 may be implemented as a new SR latch formed by adding delay units and a T/4-D1 delayed clock selection function to a SR latch.

A duty 50 2× clock source generation block 500 may be implemented using a basic SR latch to generate a clock with a 50% duty cycle.

A duty 50 2×CLK_OUT source block 610 may be implemented as a driver circuit.

A duty 50 1× clock 90° shift clock source generation block 620 may be implemented using a D flip-flop (F/F) that is synchronized to a falling edge of a 2×CLK_OUT_50 signal.

A duty 50 1× clock source generation block 630 may be implemented using a D flip-flop (F/F) that is synchronized to a rising edge of the 2×CLK_OUT_50 signal.

Meanwhile, the digital clock generation apparatus according to the embodiment of the present invention may further include a 1×CLK_OUT buffer block 640, a variable duty 2×CLK_OUT buffer block 650, a non-overlapping 2×CLK_OUT1 buffer block 660, and a non-overlapping 2×CLK_OUT2 buffer block 670 so as to provide different clock signals with different delay times and clock signals with variable duty.

The 1×CLK_OUT buffer block 640 temporarily stores the input clock signal (the 1×CLK_IN signal) and then outputs the input clock signal without any change.

Further, the variable duty 2×CLK_OUT buffer block 650 receives the generated clock signal (the 2×CLK_IN signal) and outputs a variable duty 2× CLK_OUT signal with various duty cycles required for a load.

Meanwhile, the non-overlapping 2×CLK_OUT1 buffer block 660 supplies a first phase clock signal (a 2×CLK_p1 signal) to various blocks that use the first phase clock signal. Here, the 2×CLK_p1 signal is generated such that a duty cycle D1 thereof is changed according to the 2×CLK_IN signal.

Further, the non-overlapping 2×CLK_OUT2 buffer block 670 supplies a second phase clock signal (a 2×CLK_p2 signal) to blocks that use the second phase clock signal. Here, the 2×CLK_p2 signal is a clock signal which is generated by phase shifting the 2×CLK_IN signal by 90 degrees (T/4 time). That is, a T/4 time based on the 1×CLK_IN signal is a time reflecting a total delay time (DT).

Therefore, according to an embodiment of the present invention, by generating a multiplied clock signal using a delay time and a duty cycle and providing various clock signals with a duty cycle, accuracy of clock signals with a 50% duty cycle may be improved, and various clocks may be output to implement a digital clock generation apparatus which has a very high applicability and is easy to implement in hardware.

Hereinafter, a flowchart for describing a digital clock generation method according to an embodiment of the present invention is shown below.

Figure 5:
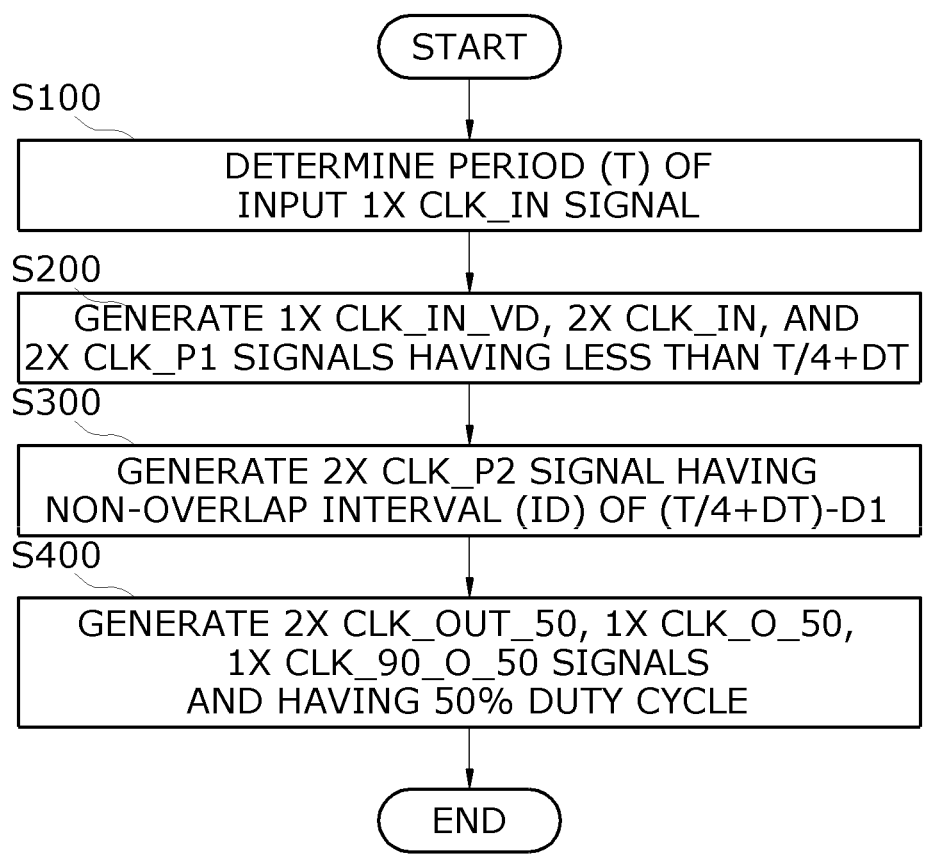
FIG. 5 is a flowchart for describing a digital clock generation method according to an embodiment of the present invention.

As shown in FIG. 5, the digital clock generation method according to the embodiment of the present invention may be performed by a digital clock generation apparatus.

First, a period T of a 1×CLK_IN signal is determined (S100).

Next, 1×CLK_IN_VD, 2×CLK_IN, and 2×CLK_p1 signals having a maximum duty cycle D1 less than T/4+DT are generated based on the 1× CLK_IN signal (S200). Here, in operation S200 of generating the 1×CLK_IN_VD, 2×CLK_IN, and 2×CLK_p1 signals having the maximum duty cycle D1 less than T/4+DT, a duty cycle D1 of each of the 1×CLK_IN_VD, 2×CLK_IN, and 2×CLK_p1 signals may be less than T/4+DT.

Meanwhile, in an operation of generating the 1×CLK_IN_VD signal, a delay time DT is determined according to the determined period T.

Thereafter, delayed clock signals are generated using the determined delay times (T/4 and DT). A duty cycle value which will be used for multiplication is determined such that one of the delayed clock signals, which are generated in this manner, may be used for multiplication.

As described above, the determined duty cycle value is used to generate a multiplied clock signal. That is, the multiplied clock signal is generated using the input clock signal and the delayed clock signal of which the duty cycle value is less than the sum of the determined delay time T/4 and the delay time DT.

The multiplied clock signal is used to generate a first phase clock signal and a second phase clock signal having a preset interval between phases thereof.

Here, the delayed clock signal having the duty cycle of less than T/4+DT and the multiplied clock signal having the delay time are used as the first phase clock signal.

On the other hand, a delayed clock signal having a duty cycle of T/4+DT or more and the input clock signal are used as the second phase clock signal (S300). That is, the second phase clock signal has a non-overlap interval ID with respect to the first phase clock signal. Here, the non-overlap interval ID may be equal to (T/4+DT)−D1.

Next, 2×CLK_OUT_50, 1×CLK_O_50, and 1×CLK_90_O_50 signals having a 50% duty cycle are generated based on the first phase clock signal (the 2×CLK_p1 signal) and the second phase clock signal (the 2×CLK_p2 signal) (S400).

That is, the generated first and second phase clock signal may be input and a duty cycle clock signal having a preset duty cycle may be generated.

Figure 6:
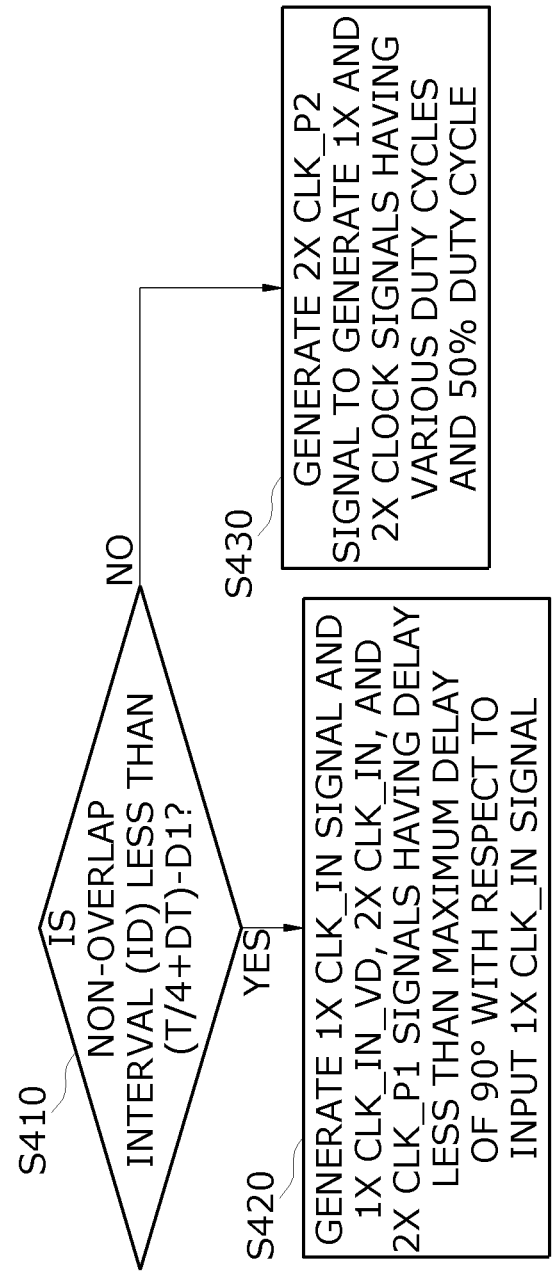
FIG. 6 is a flowchart for describing operations of generating 2×CLK_O_50, 1×CLK_O_50, and 1×CLK_90_O_50 signals having a 50% duty cycle on the basis of 2×CLK_p1 and 2×CLK_p2 signals of FIG. 5.

Here, FIG. 6 is a flowchart for describing, in detail, operation S400 of generating a 2×CLK_p2 signal of which a non-overlap interval ID between the 2×CLK_p1 signal and the 2×CLK_p2 signal is (T/4+DT)−D1.

It is determined whether the non-overlap interval ID between the 2×CLK_p1 signal and the 2×CLK_p2 signal is less than (T/4+DT)−D1 (S410).

In operation S410 of the determination, when it is determined that the non-overlap interval ID is less than (T/4+DT)−D1 (YES), a 1×CLK_IN signal and 1×CLK_IN_VD, 2×CLK_IN, and 2×CLK_p1 signals having a delay less than a maximum delay of 90° with respect to the 1×CLK_IN signal are generated (S420).

In operation S410 of the determination, when it is determined that the non-overlap interval ID is equal to T/4+DT (NO), a 2×CLK_p2 signal may be generated and 1× and 2× clock signals having various duty cycles and a 50% duty cycle may be generated.

As described above, in the present invention, under a condition in which the duty cycle D1 of each of the 1×CLK_IN_VD, 2×CLK_IN, and 2×CLK_p1 signals is less than T/4+DT and the non-overlap interval ID between the 2×CLK_p1 signal and the 2×CLK_p2 signal is less than (T/4+DT)−D1, the input 1×CLK_IN signal and the 1×CLK_IN_VD, 2×CLK_IN, and 2×CLK_p1 signals having a delay less than a maximum delay of 90° with respect to the input 1× CLK_IN signal are generated, the 2×CLK_p2 signal is generated at T/4+DT, and the 1× and 2× clock signals having various duty cycles and a 50% duty cycle are generated.

Thereafter, at least one of the generated multiplied clock signal, the generated first phase clock signal, the generated second phase clock signal, and the generated duty cycle clock signal is output.

As described above, according to the embodiment of the present invention, an input clock signal, a multiplied clock signal, and a clock signal having a duty cycle may be generated and provided by programming a delay time and a duty cycle.

According to the embodiment of the present invention, by providing a multiplied clock signal, various clock signals having a duty cycle, and a phase shifted clock signal using a programmable function of a delay time and a duty cycle, the accuracy of the duty cycle clock signals can be improved, and various clocks can be output to implement a digital clock generation apparatus and method which has a very high applicability and is easy to implement in hardware.

Since the duty cycle clock signal used in the present invention is a clock signal used as a basic clock in many clock systems, the accurate duty cycle clock generation is very important.

While the present invention has been described in detail with reference to the exemplary embodiments illustrated in accompanying drawings, these should be considered in a descriptive sense only, and it will be understood by those skilled in the art that by various alterations and modifications, other embodiments may be made. Therefore, the scope of the invention is defined by the appended claims.

What is claimed is:

1. A digital clock generation apparatus comprising:
   a delayed clock generation unit configured to generate a plurality of delayed clock signals with respect to an input clock signal;
   a delayed clock selection unit configured to select one of the generated delayed clock signals;
   a multiplied clock generation unit configured to generate a multiplied clock signal, the multiplied clock signal having a frequency that is multiplied by a preset multiple using the selected delayed clock signal and the input clock signal;
   a phase separation unit configured to generate a first phase clock signal and a second phase clock signal, which have a preset interval between phases thereof, from the multiplied clock signal;
   a duty cycle processing unit configured to receive the generated first and second phase clock signals and generate a duty cycle clock signal having a preset duty cycle; and
   a clock signal output unit configured to output at least one of the input clock signal, the generated multiplied clock signal, the generated first phase clock signal, the generated second phase clock signal, and the generated duty cycle clock signal,
   wherein the delayed clock generation unit is formed by sequentially chaining a plurality of delay units and generates the delayed clock signals so as to have various delay times, on the basis of the input clock signal according to delay times programmed between the delay units.

2. The digital clock generation apparatus of claim 1, wherein the multiplied clock generation unit generates the multiplied clock signal so that the multiplied clock signal is multiplied by being synchronized to the selected delayed clock signal and each of rising and falling edges of the input clock signal.

3. The digital clock generation apparatus of claim 1, wherein:
the multiplied clock generation unit generates the multiplied clock signal to have a frequency twice a frequency of the input clock signal;
a duty cycle of the generated multiplied clock signal is determined by the input clock signal and the selected delayed clock signal; and
the duty cycle ranges from zero to one quarter of a period (T) of the input clock signal.

4. The digital clock generation apparatus of claim 1, wherein the phase separation unit generates the first phase clock signal in a high cycle of the multiplied clock signal and generates the second phase clock signal, which is a two-phase non-overlap clock in which two phases do not overlap each other, in a low cycle of the multiplied clock signal.

5. The digital clock generation apparatus of claim 1, wherein the duty cycle processing unit generates the duty cycle clock signal with the preset duty cycle by maintaining a non-overlap interval (ID) of (T/4+DT)−D1 between the first phase clock signal and the second phase clock signal.

6. The digital clock generation apparatus of claim 1, wherein the clock signal output unit includes a first output unit which outputs the duty cycle clock signal generated by the duty cycle processing unit without any change.

7. The digital clock generation apparatus of claim 1, wherein the clock signal output unit includes a second output unit which outputs a phase shifted signal which is obtained by phase-shifting the duty cycle clock signal generated by the duty cycle processing unit at a preset angle and dividing a frequency of the duty cycle clock signal to become a frequency of the input clock signal.

8. The digital clock generation apparatus of claim 1, wherein the clock signal output unit includes a third output unit which outputs a duty signal, which is divided by a frequency of the input clock signal with respect to the duty cycle clock signal generated by the duty cycle processing unit and has a same frequency as the input clock signal.

9. The digital clock generation apparatus of claim 8, wherein the clock signal output unit includes a fourth output unit which receives the input clock signal and outputs the input clock signal without any change.

10. The digital clock generation apparatus of claim 1, wherein the clock signal output unit includes a fifth output unit which receives the first phase clock signal generated by the multiplied clock generation unit and outputs variable duty signals having various duty cycles required for a load.

11. The digital clock generation apparatus of claim 1, wherein the clock signal output unit includes a sixth output unit which outputs the first phase clock signal generated by the phase separation unit without any change.

12. The digital clock generation apparatus of claim 1, wherein the clock signal output unit includes a seventh output unit which outputs the second phase clock signal generated by the phase separation unit so as to generate a phase difference of 90 degrees with respect to the first phase clock signal.

13. A digital clock generation method comprising:
determining a period (T) of an input clock signal;
determining a delay time (DT) on the basis of the period (T) of the input clock signal and generating a delayed clock signal using the determined delay time (DT);
generating a multiplied clock signal having a duty cycle value which is determined based on the period (T) of the input clock signal and having a frequency of a predetermined multiple of a frequency of the input clock signal;
generating a first phase clock signal and a second phase clock signal, which have a preset interval between phases thereof, from the multiplied clock signal;
receiving the generated first and second phase clock signals and generating a duty cycle clock signal having a preset duty cycle; and
outputting at least one of the generated multiplied clock signal, the generated first phase clock signal, the generated second phase clock signal, and the generated duty cycle clock signal,
wherein the outputting of the at least one of the generated multiplied clock signal, the generated first phase clock signal, the generated second phase clock signal, and the generated duty cycle clock signal includes outputting a signal having a same frequency as the frequency of the input clock signal, which is obtained by dividing the duty cycle clock signal generated by the duty cycle processing unit by the frequency of the input clock signal.

14. The digital clock generation method of claim 13, wherein the generating of the first phase clock signal and the second phase clock signal includes:
programming the multiplied clock signal by adding the delay time (DT) to a predetermined delay period (T/4) of the input clock signal and then determining a non-overlap interval (ID) from which a determined duty cycle is subtracted; and
determining the multiplied clock signal as a first phase shifted clock signal and generating a second phase shifted clock signal using the determined first phase shifted clock signal and the determined non-overlap interval (ID).

15. The digital clock generation method of claim 13, wherein the outputting of the at least one of the generated multiplied clock signal, the generated first phase clock signal, the generated second phase clock signal, and the generated duty cycle clock signal includes outputting the generated duty cycle clock signal, which is obtained by processing the duty cycle clock signal generated by the duty cycle processing unit with the preset duty cycle, without any change.

16. A digital clock generation method comprising:
determining a period (T) of an input clock signal;
determining a delay time (DT) on the basis of the period (T) of the input clock signal and generating a delayed clock signal using the determined delay time (DT);
generating a multiplied clock signal having a duty cycle value which is determined based on the period (T) of the input clock signal and having a frequency of a predetermined multiple of a frequency of the input clock signal;
generating a first phase clock signal and a second phase clock signal, which have a preset interval between phases thereof, from the multiplied clock signal;
receiving the generated first and second phase clock signals and generating a duty cycle clock signal having a preset duty cycle; and outputting at least one of the generated multiplied clock signal, the generated first phase clock signal, the generated second phase clock signal, and the generated duty cycle clock signal, wherein the outputting of the at least one of the generated multiplied clock signal, the generated first phase clock signal, the generated second phase clock signal, and the generated duty cycle clock signal includes outputting a phase shifted signal which is obtained by phase-shifting the generated duty cycle clock signal generated by the duty cycle processing unit at a preset angle and dividing a frequency of the duty cycle clock signal to become the frequency of the input clock signal.

* * * * *